(12) United States Patent
Mahalingam et al.

(10) Patent No.: US 10,651,039 B2
(45) Date of Patent: May 12, 2020

(54) POLYSILICON GATE FORMATION IN CMOS TRANSISTORS

(71) Applicant: Texas Instruments Incorporated, Dallas, TX (US)

(72) Inventors: Pushpa Mahalingam, Richardson, TX (US); Umamaheswari Aghoram, Richardson, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 30 days.

(21) Appl. No.: 15/858,515

(22) Filed: Dec. 29, 2017

(65) Prior Publication Data

US 2019/0206689 A1    Jul. 4, 2019

(51) Int. Cl.
*H01L 21/28*      (2006.01)
*H01L 21/321*     (2006.01)
*H01L 21/285*     (2006.01)
*H01L 29/423*     (2006.01)
*H01L 29/49*      (2006.01)
(Continued)

(52) U.S. Cl.
CPC .... *H01L 21/28035* (2013.01); *H01L 21/0245* (2013.01); *H01L 21/0262* (2013.01); *H01L 21/02488* (2013.01); *H01L 21/02502* (2013.01); *H01L 21/02532* (2013.01); *H01L 21/28525* (2013.01); *H01L 21/321* (2013.01); *H01L 29/42372* (2013.01); *H01L 29/4916* (2013.01); *H01L 29/4925* (2013.01); *H01L 29/6659* (2013.01); *H01L 29/66568* (2013.01); *H01L 21/02592* (2013.01); *H01L 21/02667* (2013.01)

(58) Field of Classification Search
CPC ........... H01L 21/23035; H01L 29/4916; H01L 29/4925
See application file for complete search history.

(56) References Cited

U.S. PATENT DOCUMENTS 5,767,004 A * 6/1998 Balasubramanian ........................ H01L 21/28061
257/E21.2
6,057,213 A * 5/2000 Lee ...................... H01L 21/2022
438/486

(Continued)

OTHER PUBLICATIONS

PCT Search Report for Application No. PCT/US 2018/068131, dated Apr. 11, 2019.

*Primary Examiner* — Jaehwan Oh
*Assistant Examiner* — Molly K Reida
(74) *Attorney, Agent, or Firm* — Andrew R. Ralston; Charles A. Brill; Frank D. Cimino (57) ABSTRACT

A method of forming a semiconductor device includes forming source regions and drain regions in a semiconductor substrate, and a gate electrode over said semiconductor substrate and between said source and drain regions. The gate electrode is formed from a first semiconductor gate electrode layer deposited on said gate dielectric layer at a first substrate temperature. A second semiconductor gate electrode layer is deposited on the first semiconductor gate electrode layer at a second substrate temperature greater than said first temperature. The two gate electrode layers may be annealed to form a homogenous polycrystalline layer with improved grain size distribution, thereby improving transistor matching in a semiconductor device.

22 Claims, 4 Drawing Sheets

FIG. 7

(51) Int. Cl.
*H01L 29/66* (2006.01)
*H01L 21/02* (2006.01)

(56) References Cited

U.S. PATENT DOCUMENTS

| | | | |
|---|---|---|---|
| 6,150,251 A * | 11/2000 | Yew | H01L 21/28035 257/E21.197 |
| 6,294,442 B1 * | 9/2001 | Kamal | H01L 21/2022 438/486 |
| 2006/0105515 A1 | 5/2006 | Amos et al. | |
| 2016/0372578 A1 | 12/2016 | Levy et al. | |
| 2017/0040313 A1 | 2/2017 | Chen et al. | |
| 2017/0221983 A1 | 8/2017 | Srinivasan et al. | |

\* cited by examiner

POLYSILICON GATE FORMATION IN CMOS TRANSISTORS

FIELD

This disclosure relates to the field of semiconductor devices, and more particularly, but not exclusively, to deposition of polysilicon gates in CMOS transistors to reduce transistor mismatch.

BACKGROUND

Matching of figures of merit (FOMs) in MOS transistors can be an important design parameter in many analog CMOS applications. Such matching involves statistical differences between pairs of identically-designed and nominally identically-used transistors. In analog circuit blocks, like A/D converters, threshold voltage differences as small as one millivolt or less between transistors in a matched set can be sufficient to adversely impact the performance and/or yield of a product employing the transistors.

Typical MOS transistors include a polysilicon gate electrode over a gate dielectric layer. Polysilicon includes grain boundaries along which dopant atoms may preferentially diffuse. Such diffusion may cause dopant atoms to concentrate at the interface between the gate electrode and the gate dielectric. Moreover, the dopant atoms may be further concentrated at the intersections of the grain boundaries and the interface between the gate electrode and the gate dielectric. The localized concentrations of dopant atoms may adversely impact the stability and matching of various transistor FOMs, thereby constraining the design of an electronic device of which the transistors are a part.

SUMMARY

The inventors disclose various methods and devices that may be beneficially applied to manufacturing transistors in integrated circuits (ICs). While such embodiments may be expected to provide improvements in performance and/or yield of such transistors and ICs, no particular result is a requirement of the present invention unless explicitly recited in a particular claim.

The present disclosure introduces a method, e.g. of forming a semiconductor device. The method includes forming source regions and drain regions in a semiconductor substrate, and forming a gate electrode over the semiconductor substrate and between the source and drain regions. The gate electrode is formed from a first semiconductor gate electrode layer and a second semiconductor gate electrode layer. The first gate electrode layer is deposited on the gate dielectric layer at a first substrate temperature, and the second gate electrode layer is deposited on the first gate electrode layer at a second substrate temperature greater than the first temperature.

Another embodiment provides a method, e.g. of forming a semiconductor device. The method includes providing a semiconductor substrate and forming source/drain regions within the substrate. A gate oxide layer is formed over the substrate between the source/drain regions. A first semiconductor layer is formed on the gate oxide layer at a first growth rate. A second semiconductor layer is formed on the first semiconductor layer at a second greater growth rate.

Another embodiment provides a device, e.g. an integrated circuit (IC). The IC includes a semiconductor substrate and a plurality of MOS transistors formed over the substrate. Metal lines located within one or more dielectric layers interconnect the transistors. Each of the MOS transistors includes a semiconductor gate electrode formed from a first semiconductor layer formed by a first semiconductor deposition process having a first process temperature, followed by a second semiconductor deposition process having a second greater process temperature.

DETAILED DESCRIPTION

The present disclosure is described with reference to the attached figures. The figures are not drawn to scale and they are provided merely to illustrate the disclosure. Several aspects of the disclosure are described below with reference to example applications for illustration. It should be understood that numerous specific details, relationships, and methods are set forth to provide an understanding of the disclosure. The present disclosure is not limited by the illustrated ordering of acts or events, as some acts may occur in different orders and/or concurrently with other acts or events. Furthermore, not all illustrated acts or events may be required to implement a methodology in accordance with the present disclosure.

MOS (metal oxide semiconductor) transistors typically include a polysilicon gate electrode located over a gate dielectric. A threshold voltage, $V_{TH}$, is the voltage at which a normally-off transistor begins to significantly conduct, or at which a normally-on transistor begins to significantly increase resistance. Due to so-called short channel effects, the $V_{TH}$ may vary among a population of nominally identical transistors, e.g. due to one or more of random fluctuations of (i) dopant atoms in the channel region of the transistors, (ii) gate doping, (iii) fixed oxide charge, and (iv) surface roughness scattering. This variation may be quantified by the standard deviation of the threshold voltage, $\sigma(V_{TH})$. Typically this value is approximately inversely proportional to $\sqrt{W^*L}$, where W is the transistor gate width, and L is the transistor gate length. The constant of proportionality is referred to as $A_{VT}$, also sometimes called the Pelgrom coefficient, which is well known to those skilled in the semiconductor arts. (See, e.g., Xiaobin Yuan, et al., "Transistor Mismatch Properties in Deep-Submicrometer CMOS Technologies," IEEE Transactions on Electron Devices, vol. 58, no. 2, pp. 335-342, February 2011, incorporated herein by reference.) Referring to Eq. 1 below, $A_{VT}$ may be determined experimentally from the slope of a plot of $\sigma(V_{TH})$ vs $WL^{-1/2}$, sometimes referred to as a Pelgrom plot:

$$\sigma(V_{TH}) = A_{VT} 1/\sqrt{WL}. \qquad (1)$$

As a figure of merit (FOM), $A_{VT}$ characterizes the scatter of $V_{TH}$ as a function of the transistor area of a population of transistors having a particular nominal gate area. A larger value (greater slope of Eq. 1) indicates a greater scatter of $V_{TH}$ as gate area decreases, while a smaller value indicates less scatter of $V_{TH}$ with decreasing gate area. In some applications, such as some analog devices, the sensitivity of $V_{TH}$ to transistor size, as quantified by $A_{VT}$, constrains the minimum transistor size that may be used to ensure a desired performance of an IC in which the transistors are used. The minimum transistor size in turn constrains the minimum size of the integrated circuit in which such transistors are used. As described below, various embodiments are provided that are expected to reduce $A_{VT}$, thereby decreasing transistor $V_{TH}$ scatter and/or reducing the area needed to implement circuits from such transistors.

In some circumstances dopants from the gate may diffuse to the transistor channel. It is thought that dopant diffusion from the gate electrode to the gate dielectric interface occurs via two paths. A first path is through bulk silicon of silicon grains to the grain surfaces. This diffusion is expected to be relatively slow. A second relatively faster path is along the boundaries between the grains to the interface between the gate electrode and the gate dielectric. It is believed that when the concentration of relatively mobile dopant atoms is high enough at the gate/dielectric interface the concentration gradient may drive dopant diffusion through the gate dielectric layer. This effect is expected to be greater for transistors with a thin gate dielectric and relatively mobile gate dopants such as boron. Such movement of dopants may be uncorrelated with other influences on $V_{TH}$ and may therefore increase the sensitivity of $V_{TH}$ variation to gate area. Such diffusion may be activated over a small time scale by thermal cycles that follow the formation of the gate electrode during manufacture of the electronic device. Similar diffusion may be activated over a longer time scale by the temperature of operation of the electronic device. Such diffusion is inherently stochastic, and may lead to a larger $A_{VT}$ than would be present in the absence of gate dopant diffusion.

Without limitation by theory, the inventors believe that the correlation lengths of mismatch-causing stochastic processes in the gate are directly proportional to the grain size in a polycrystalline gate electrode. Embodiments described herein and within the scope of the claimed invention(s) benefit from the recognition by the inventors that transistor matching can be improved by reducing the average grain size in polycrystalline gate electrodes, and further that the grain size in the gate electrode may be controlled, e.g. reduced and/or made more consistent, by depositing in multiple layers the semiconductor, e.g. silicon, from which the gate electrode is formed.

In some embodiments, a first silicon layer is formed on a gate dielectric layer under conditions that favor amorphous material and/or small grain size, for example at a relatively low substrate temperature during deposition. In some embodiments a second silicon layer is formed on the first silicon layer under conditions that favor polycrystalline formation, for example at a relatively high substrate temperature during deposition. It is believed that the first layer acts as a seed for crystal formation in the second layer, resulting in a larger number of smaller crystal grains in a unit area of the second layer than if the second layer were directly formed on the gate dielectric. Subsequent annealing may cause the crystals in the second layer to grow, consuming the silicon in the first layer, resulting in a homogenous polycrystalline gate electrode layer with smaller grain size than the conventional gate electrode, thereby improving transistor matching. Thus, transistors formed within the scope of the described embodiments are expected to exhibit superior uniformity of $V_{TH}$ and $I_{D_{SAT}}$ relative to conventional transistors due to significant reduction in random fluctuations of $V_{TH}$.

Figure 1:
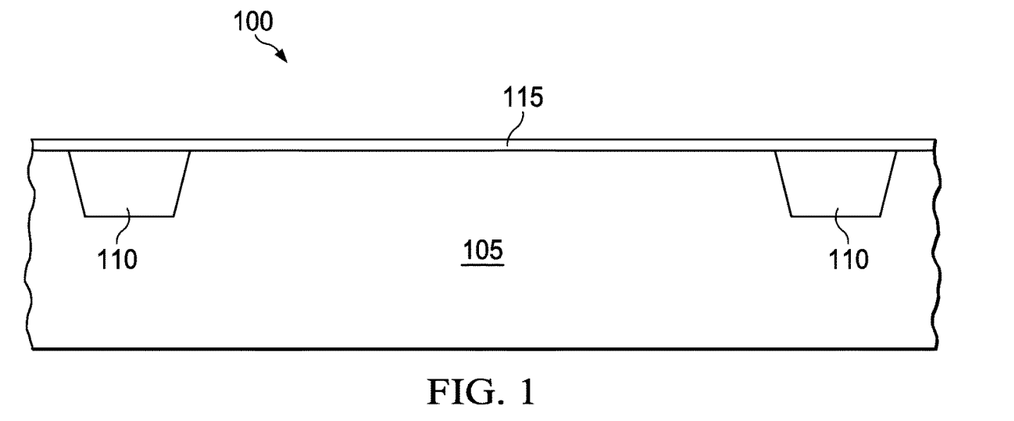
FIG. 1 illustrates a semiconductor device, e.g. a MOS transistor, at an early stage of manufacturing.

Turning to FIG. 1, a method is described of forming an electronic device 100 according to various embodiments. In the illustrated sectional view, a semiconductor substrate 105, e.g. a wafer, has been processed to form isolation structures 110, e.g. STI structures, and a gate dielectric layer 115. The substrate 105 may be any suitable substrate, e.g. silicon, silicon-on-insulator (SOI) or SiGe. Without loss of generality the substrate 105 may be described as silicon in the following discussion. Formation of the isolation structures 110 may be by any suitable process, e.g. shallow trench isolation (STI). The gate dielectric layer 115 may be a thermally-grown oxide of the substrate 105 material, e.g. $SiO_2$.

Figure 2A:
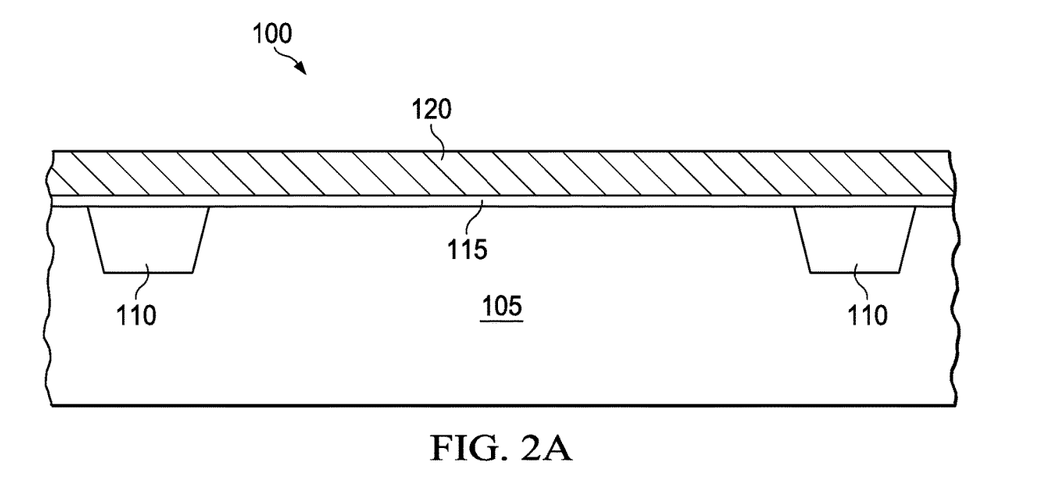
FIGS. 2A-2C illustrate the formation of a gate electrode layer of the device of FIG. 1 according to one embodiment in which a first amorphous silicon layer is formed, followed by a second polycrystalline silicon layer.
Figure 2B:
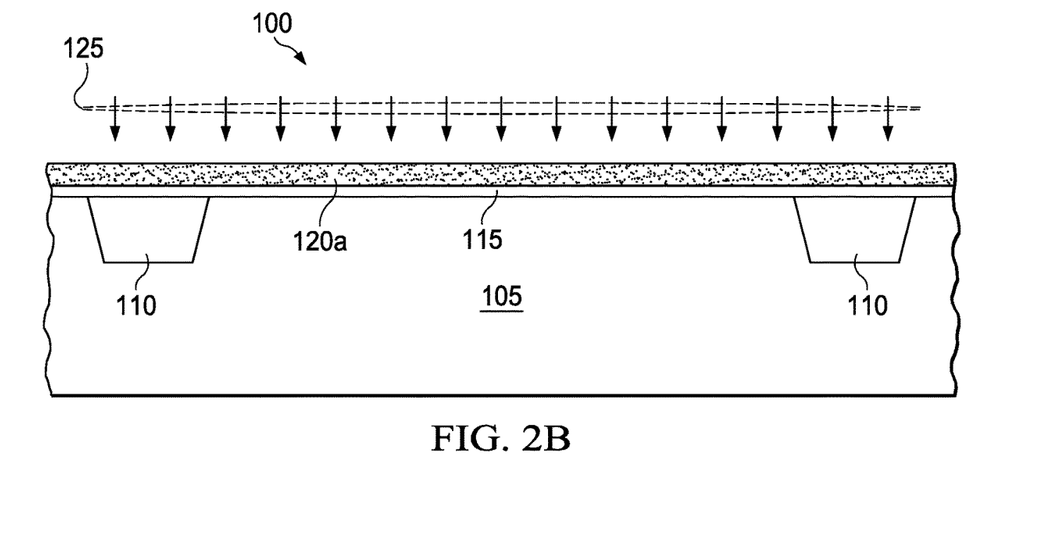
Figure 2C:
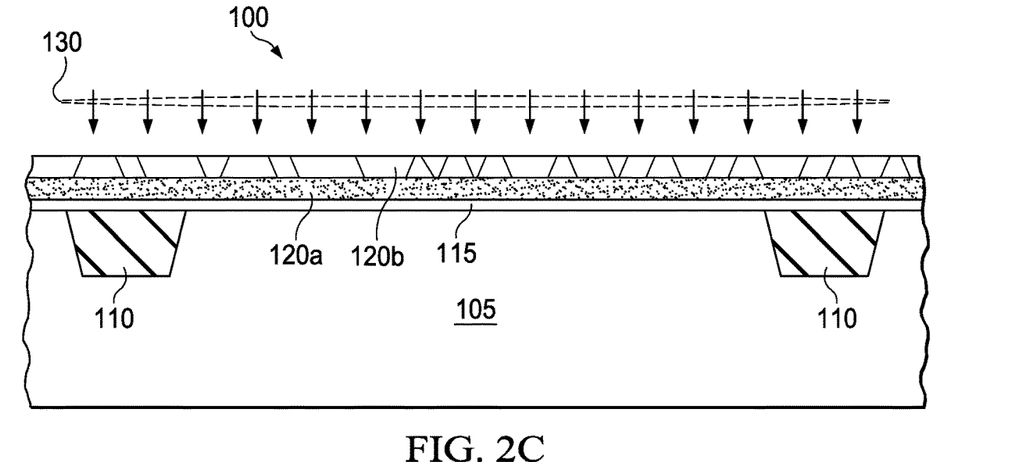

FIGS. 2A-2C illustrate the formation of a gate electrode layer 120 according to various embodiments, and are referred to concurrently in the following discussion. The gate electrode layer 120 is shown schematically as a single layer in FIG. 2A. However, in various embodiments the gate electrode layer 120 is formed by multiple discrete processes that result in the described improved $V_{TH}$ matching of instances of the device 100 in an IC. FIG. 2B illustrates a first deposition process 125 that forms a first gate electrode sublayer 120a on the gate dielectric layer 115. FIG. 2C illustrates a second deposition process 130 that forms a second gate electrode sublayer 120b on the first gate electrode sublayer 120a. As described further below, process parameters of the first deposition process 125 are selected to favor formation of amorphous material and/or relatively small crystal grains in the first sublayer 120a. Process parameters of the second deposition process 130 are selected to disfavor formation of amorphous material, instead favoring polycrystalline material. Each of the first deposition process 125 and the second deposition process 130 process may be a CVD (Chemical Vapor Deposition) process, and the sublayers 120a, 120b may each comprise an elemental semiconductor, e.g. silicon, or a semiconductor alloy, e.g. SiGe. The following discussion assumes silicon deposition without limitation.

As described above, the first sublayer 120a is formed under conditions that favor smaller grain size and/or amorphous morphology of the silicon. Without limitation thereto, the first sublayer 120a is illustrated in FIG. 2B as an amorphous layer, while recognizing that the first sublayer 120a may also include some crystalline silicon. In this context, an "amorphous" layer is a layer than comprises no more than about 20% crystalline material. For example, a silicon growth process may be performed in a CVD furnace. Under some process conditions, formation of a silicon layer by CVD at a lower substrate temperature, while holding other process parameters constant, results in a silicon layer with smaller grains and/or greater amorphous content. Conversely, a higher substrate temperature generally results in larger grains and/or lower amorphous content. Moreover, the silicon growth rate at lower temperatures is typically lower than at higher temperatures, and the residual stress of the resulting silicon layer formed at the lower temperature is typically higher than that of the silicon layer formed at the higher temperature.

In a more specific example in which the first sublayer 120a comprises silicon, the first sublayer 120a may be formed in one of several commercially available polysilicon deposition tools with a substrate (e.g. wafer stage) temperature in a range from about 550° C. to about 600° C., for example within a range of about 595° C. to about 605° C., for example about 600° C. A silane feedstock may be used with a flow rate less than about 400 sccm, for example in a range from about 240 sccm to about 305 sccm, while maintaining a pressure in a range from about 190 mTorr (about 25 Pa) to about 210 mTorr (about 28 Pa), for example about 200 mTorr (about 26.5 Pa). These process parameters may result in a growth rate of about 6 nm/min. In some embodiments, the target thickness of the first sublayer 120a is about 80 nm, corresponding to a deposition time of about 13'20" for such embodiments. The morphology of the first sublayer 120a formed consistent with these parameter ranges is expected to be amorphous and/or polycrystalline with small grain size, with amorphous formation increasingly favored at the lower end of the temperature range.

FIG. 2C illustrates the formation of the second sublayer 120b on the first sublayer 120a by the second deposition process 130. Preferably the second sublayer 120b is formed without exposing the device 100 to atmospheric ambient after formation of the first sublayer 120a. The second deposition process 130 may be substantially similar to the first deposition process 125 as previously described, with the exception that the first deposition process 125 (first sublayer 120a) is performed at a first, lower formation temperature, and the second deposition process 130 (second sublayer 120b) is performed at a second, higher formation temperature. Without limitation thereto, the second sublayer 120b is shown in FIG. 2C as a polycrystalline layer, while recognizing that the second sublayer 120b may also include some amorphous silicon. In this context, a "polycrystalline" layer is a layer than comprises at least about 80% crystalline material in a plurality of crystal grains. An intervening temperature ramp-up process may be performed between the first deposition process 125 and the second deposition process 130, during which the temperature of the process stage may be raised while other process variables are held constant for process chamber stability. The substrate 105 may be removed from the process chamber during the ramp-up to prevent additional silicon formation during this step.

In some embodiments the temperature difference between the first and second temperatures is at least about 40° C. In one embodiment, the second formation temperature is in a range of about 645° C. to about 655° C., for example about 650° C. Under these conditions, the deposition rate may be about 12 nm/min, or about twice the deposition rate of the first sublayer 120a. In some embodiments, the target thickness of the second sublayer 120b is again about 80 nm, resulting in a deposition time of about 6'40".

While the relative thickness of the first sublayer 120a to the second sublayer 120b is about 1:1 in the preceding embodiment, in other embodiments the proportions may be different. A minimum thickness of the first sublayer 120a may be constrained by stability of the deposition process and/or by the minimum thickness of the second sublayer 120b needed to provide the described benefit of small grain size in the final gate electrode layer 120. Thus in some embodiments for which a 160 nm gate thickness is desired, a minimum thickness of the first sublayer 120a may be about 10 nm. A maximum thickness of the first sublayer 120a may be constrained by, e.g., stress in the first sublayer 120a and/or by the maximum thickness of the second sublayer 120b needed to provide the described benefit of smaller grain size in the final gate electrode layer 120. While the maximum thickness of the first sublayer 120a will in general depend on the target thickness of the final gate electrode layer 120, 80 nm may be suitable in some embodiments in which the total thickness of the gate electrode layer 120 is about 160 nm.

In various embodiments the ratio of the first sublayer 120a thickness to the second sublayer 120b may be in a range between about 1:7 to about 1:1. In some embodiments it may be preferable that the ratio be in a range between about 1:2 to about 1:3, e.g. to reduce transient stress of the production wafer. In yet other embodiments it may be preferred that the ratio be in a range between about 1:2 to about 1:1, e.g. to favor the desirable grain size and distribution of silicon crystal grains after annealing and crystal growth by subsequent thermal cycles.

As mentioned previously, the morphology of the second sublayer 120b formed consistent with the described process parameters is expected to disfavor formation of amorphous Si, and favor formation of polycrystalline Si. In the absence of the first sublayer 120a, the process used to form the second sublayer 120b would be expected to produce relatively large crystal grains, e.g. at least about 2-5 times the size of crystal grains formed directly on the gate dielectric layer 115. In other words, under nominally identical process conditions, if the second sublayer 120b were formed directly on the gate dielectric layer 115, the size of the grains would be expected to be significantly larger. For example, and without limitation thereto, the grains in the second sublayer 120b formed on the first sublayer 120a may have a mean diameter, as observed at the surface, of about 50 nm with a standard deviation of about 10 nm. In contrast, a silicon layer formed directly on a gate dielectric may be expected to have a mean diameter as observed at the surface of about 200 nm with a standard deviation of about 20 nm.

Figure 3:
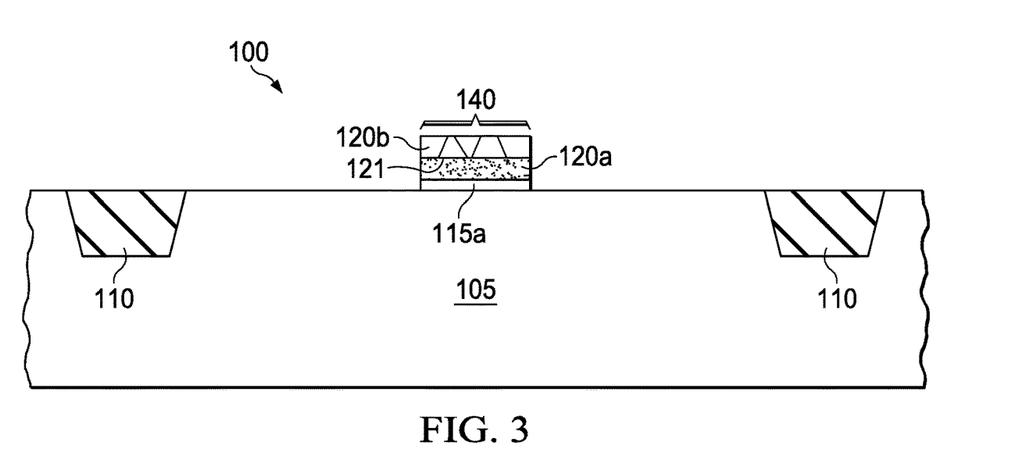
FIG. 3-6 illustrate the electronic device of FIG. 1 at stages of formation after forming the gate electrode layers of FIGS. 2A-2C.

FIG. 3 illustrates the device 100 after additional processing to form a gate structure 140, with a remaining portion of the gate dielectric layer 115a, a remaining portion of the first sublayer 120a, and a remaining portion of the second sublayer 120b. In the illustrated embodiment, the device 100 has not yet been subjected to a processing temperature sufficient to anneal the sublayers 120a, 120b, so it is expected these layers will substantially retain their individual characteristics. Thus it is further expected that a distinct interface 121 will separate the first sublayer 120a from the second sublayer 120b.

Figure 4:
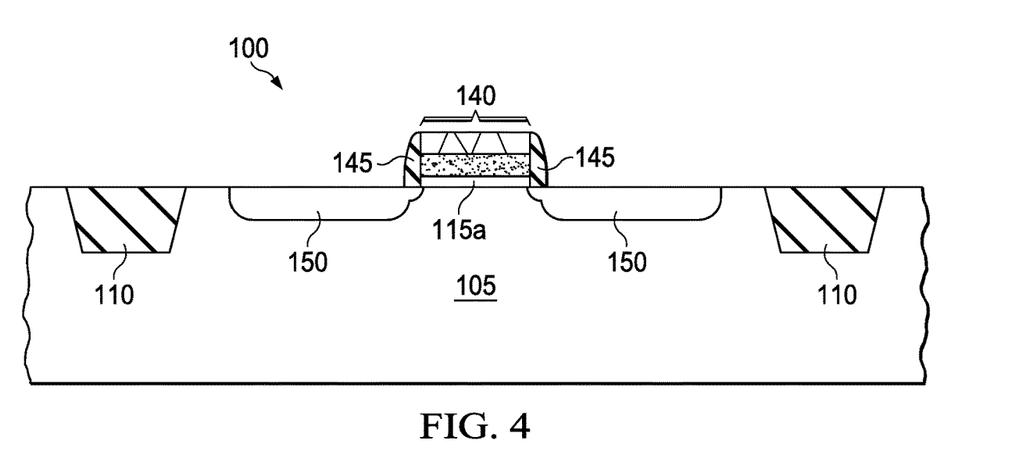

FIG. 4 illustrates the device 100 after additional processing to form dielectric spacers 145 on the sidewalls of the gate structure 140, and source/drain regions 150. The spacers 145 and source/drain regions 150 may be formed by any conventional or future-developed processes. In the illustrated embodiment the first sublayer 120a and the second sublayer 120b continue to retain their individual characteristics.

Figure 5:
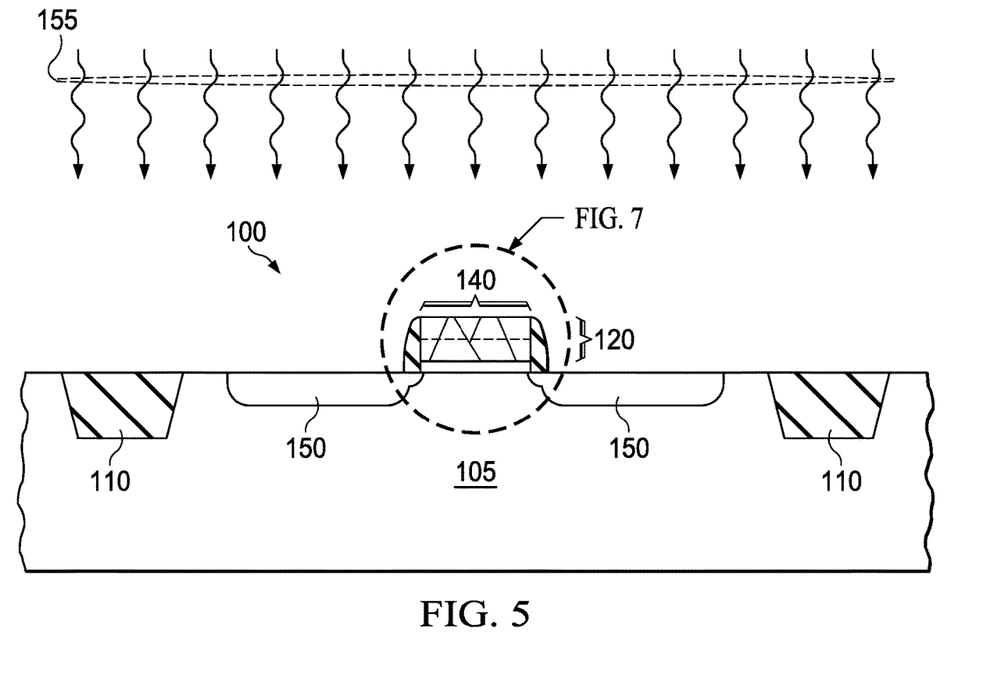

FIG. 5 illustrates the device 100 during exposure to a thermal process 155. The thermal process 155 provides energy to activate crystal grain growth in the gate structure 140. In some embodiments the thermal process 155 may be a process step typically used after forming implanted regions, e.g. the source/drain regions 150, to activate implanted dopants. Such a process may include, e.g., a rapid thermal anneal (RTA) process. In an example embodiment an RTA process is performed that heats the device 100 to 1000 C for 15 sec. In some cases the thermal process 155 may be a discrete process step used for the purpose of annealing the gate structure 140. In one nonlimiting example a suitable anneal process includes the aforementioned RTA process. In another example the device 100 is heated to about 900 C for about 20 min in a tube furnace with $N_2$ ambient. In some embodiments such an additional anneal is performed prior to the formation of the source/drain regions, e.g. at any point after formation of the second sublayer 120b.

Figure 7:
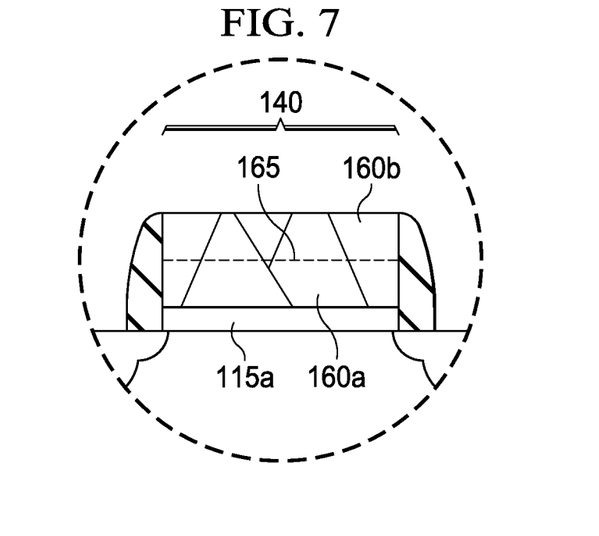
FIG. 7 illustrates a partial view of the electronic device of FIG. 5 including a gate electrode formed as illustrated in FIGS. 2A-2C, and portions of source/drain regions.

FIG. 7 illustrates a detail view of a portion of FIG. 5 that includes the gate structure 140. In the illustrated embodiment crystal grains in the second sublayer 120b have grown, incorporating silicon in the first sublayer 120a. As a result, the gate structure 140 may be a single homogeneous polycrystalline layer. In this context, a homogeneous polycrystalline layer means that the gate structure 140 is predominantly (e.g. >90%) crystalline and the interface 121 has been substantially eliminated by the growth of crystal grains across the interface 121. However, embodiments include those in which the gate structure 140 includes some amorphous silicon, e.g. up to about 20%, and those in which the gate structure 140 includes distinct populations of grains distinguished by size and/or location. A lower portion 160a of the gate structure 140, e.g. proximate the gate dielectric layer 115a, may retain some of the characteristics of the first sublayer 120a, and an upper portion 160b may retain some of the characteristics of the second sublayer 120b. For example, the lower portion 160a may have a detectably greater content of amorphous silicon than the upper portion 160b, and/or the size of any grains in the lower portion 160a may be smaller than the size of grains in the upper portion 160b. Furthermore, a residual interface 165 may be detectable between the lower portion 160a and the upper portion 160b. In this context, "detectable" means that the residual interface 165 may be located by physical characterization techniques such as, e.g. TEM or STEM. The interface may be detectable as a generally linear feature about in a same location as the interface 121. The interface 165 may be "residual" in that it may be located at about the location of the interface 121 (FIG. 3), but may be less distinct due to, e.g. growth of grains across the location of the interface. The residual interface 165 may mark a discontinuity between grains in the portions 160a, 160b, a discontinuity between amorphous silicon and crystalline material, and/or a concentration of crystal defects, such as vacancies, dislocations, interstitial atoms and twin boundaries. In some cases the residual interface 165 may be non-continuous when viewed in a physical cross-section.

Figure 6:
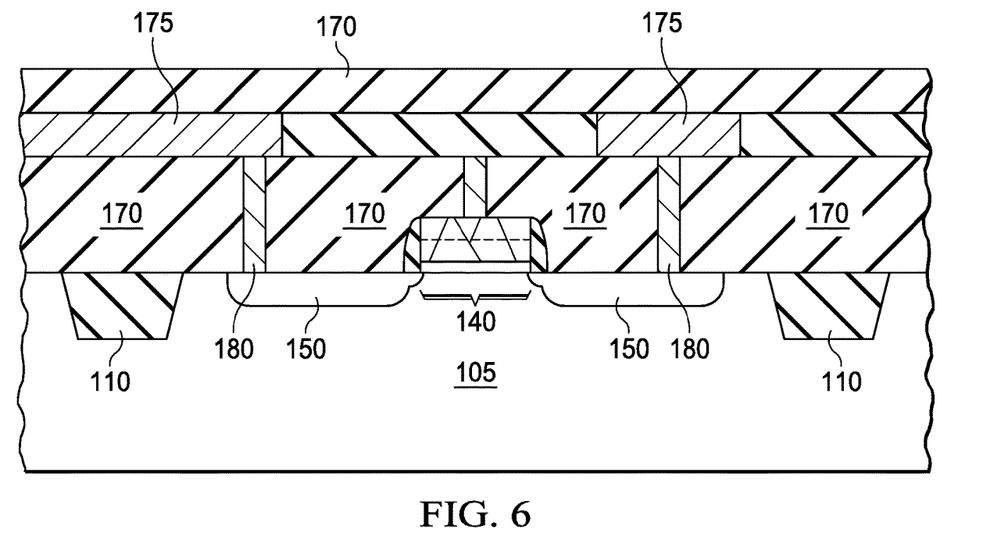

FIG. 6 shows the device 100 after additional processing, including formation of interconnect levels, which may be performed by any conventional or future-developed processes. The device 100 may be part of an integrated circuit, and thus in FIG. 6 includes representative dielectric levels 170, metal lines 175 and vias 180.

Figure 8:
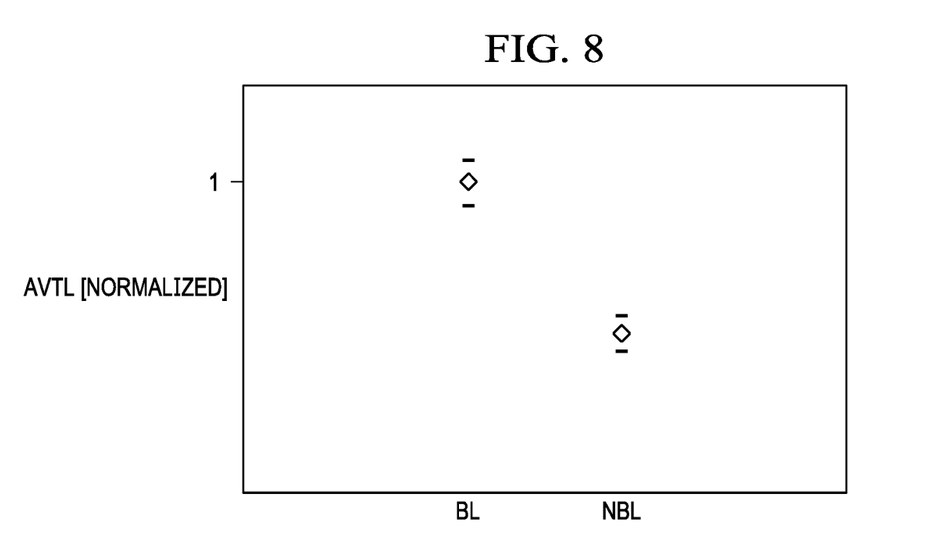
FIG. 8 illustrates normalized $A_{VT}$ values for baseline (BL) test devices and non-baseline (NBL) test devices formed according to one described embodiment, wherein the data show a lower $A_{VT}$ mean value for NBL test devices as compared to BL devices, indicating improved matching of transistors in the NBL test devices.

FIG. 8 presents a plot of normalized mean $A_{VT}$ for baseline (BL) devices and devices formed according to various embodiments described herein (non-baseline, or NBL). The BL devices were formed using a single 160 nm polysilicon deposition according to a baseline process flow. The NBL devices were formed using two 80 nm silicon deposition steps as follows:

TABLE I

| | First Silicon Deposition | Temp Ramp/Purge | Second Silicon Deposition |
|---|---|---|---|
| Target Thickness | 80 nm | N/A | 80 nm |
| Temperature | 600 C. | 600 C. → 640 C. | 650 C. |
| Pressure | 200 mTorr (26.5 Pa) | 200 mTorr (26.5 Pa) | 200 mTorr (26.5 Pa) |
| Silane Flow | 240-305 sccm | 240-305 sccm | 240-305 sccm |
| Time | 13'20" | 14' | 6'40" |

The data are plotted with upper and lower error bars marking the ±1·σ values of each mean value. The NBL devices exhibit about a 23% reduction of nominal $A_{VT}$ value relative to the BL devices, well outside the 3σ range. Thus the NBL devices clearly show a reduction of $A_{VT}$ that is statistically and operationally significant.

Without limitation by theory, the inventors believe that the reduction of $A_{VT}$ results from a smaller and/or more uniform distribution of silicon crystal grains in the completed gate electrode, thereby resulting in a more uniform distribution of grain boundaries that terminate at the interface between the gate electrode layer 120 and the gate dielectric layer 115. It is thought that this distribution results in more uniform diffusion of dopant in the gate electrode layer 120 to the gate dielectric layer 115. This effect is expected to reduce $A_{VT}$ by reducing local dopant concentration gradients that would otherwise drive diffusion of the dopants into the channel below the gate dielectric.

The reduction of $A_{VT}$, such as evidenced in the nonlimiting example of FIG. 8, indicates that 1) a target $A_{VT}$ may be met using transistors with a smaller gate area, 2) $A_{VT}$ may be reduced while keeping the gate area constant, and/or 3) a portion of the additional $A_{VT}$ margin may be used to reduce the transistor gate area while also reducing the $A_{VT}$ of the device. For example, the 23% reduction of $A_{VT}$ evident in FIG. 8 may allow an integrated circuit formed according to the described embodiment to be reduced in size by about 40% while maintaining an allowable $A_{VT}$ level without changing the $A_{VT}$.

While various embodiments of the present disclosure have been described above, it should be understood that they have been presented by way of example only and not limitation. Numerous changes to the disclosed embodiments can be made in accordance with the disclosure herein without departing from the spirit or scope of the disclosure. Thus, the breadth and scope of the present invention should not be limited by any of the above described embodiments. Rather, the scope of the disclosure should be defined in accordance with the following claims and their equivalents.

What is claimed is:

1. A method of forming a semiconductor device, comprising:
   forming source regions and drain regions in a semiconductor wafer;
   forming a gate electrode over said semiconductor substrate and between said source and drain regions;
   forming a gate dielectric layer between said gate electrode and said wafer,
   wherein said gate electrode is formed from a first semiconductor gate electrode layer deposited on said gate dielectric layer and a second semiconductor gate electrode layer deposited on said first semiconductor gate electrode layer, the second semiconductor gate electrode layer having a thickness about seven times a thickness of the first semiconductor gate electrode layer, and annealing said first and second semiconductor gate electrode layers in a wafer-level process; and said annealing results in a single homogenous polysilicon layer.

2. The method of claim 1, wherein forming the gate electrode further comprises forming said first semiconductor gate electrode layer from silane at a deposition temperature in a range from about 595° C. to about 605° C.

3. The method of claim 1, wherein forming the gate electrode further comprises forming said second semiconductor gate electrode layer from silane at a deposition temperature in a range from about 645° C. to about 655° C.

4. The method of claim 1, wherein said first semiconductor gate electrode layer is formed at a first growth rate, and said second semiconductor layer is formed at a second growth rate about two times said first growth rate.

5. The method of claim 1, wherein the first semiconductor gate electrode layer is deposited on the gate dielectric layer at a first substrate temperature and the second semiconductor gate electrode layer is deposited on the first semiconductor gate electrode layer at a second substrate temperature greater than said first substrate temperature.

6. The method of claim 1, wherein the wafer-level process includes a rapid thermal anneal (RTA) process.

7. The method of claim 1, wherein the wafer-level process includes a furnace anneal process.

8. The method of claim 1, wherein the wafer-level process includes heating the semiconductor wafer to a temperature of 950° C. or higher.

9. The method of claim 1, wherein the wafer-level process includes heating the semiconductor wafer to a temperature of about 1000° C. for about 15 s.

10. A method of forming a semiconductor device, comprising:

providing a semiconductor wafer;

locating source/drain regions within the semiconductor wafer;

forming a gate oxide layer over said wafer between said source/drain regions;

forming on said gate oxide layer a first semiconductor layer having a first thickness; and forming on said first semiconductor layer a second semiconductor layer having a second thickness about seven times the first thickness; and annealing said first and second semiconductor layers in a wafer-level process to produce a single homogenous polycrystalline layer, wherein said homogenous polycrystalline layer has a mean grain size of 50 nm and a grain size standard deviation of 10 nm.

11. The method of claim 10, wherein the first semiconductor layer is formed as an amorphous silicon layer.

12. The method of claim 11, wherein the second semiconductor layer is formed as a polycrystalline layer.

13. The method of claim 10, wherein the first semiconductor gate electrode layer is formed on said gate dielectric layer at a first growth rate, and the second semiconductor gate electrode layer is formed on said first semiconductor gate electrode layer at a second greater growth rate.

14. The method of claim 10, wherein the wafer-level process includes a rapid thermal anneal (RTA) process.

15. The method of claim 10, wherein the wafer-level process includes a furnace anneal process.

16. The method of claim 10, wherein the wafer-level process includes heating the semiconductor wafer to a temperature of 950° C. or higher.

17. The method of claim 10, wherein the wafer-level process includes heating the semiconductor wafer to a temperature of about 1000° C. for about 15 s.

18. A method of forming a semiconductor device, comprising:

providing a semiconductor wafer;

locating source/drain regions within the semiconductor wafer;

forming a gate oxide layer over said wafer between said source/drain regions;

forming on said gate oxide layer a first semiconductor layer at a first growth rate;

forming on said first semiconductor layer a second semiconductor layer at a second greater growth rate; and annealing said first and second semiconductor layers in a wafer-level process to produce a single homogenous polycrystalline layer, wherein said homogenous polycrystalline layer has a mean grain size of about 50 nm and a grain size standard deviation of about 10 nm.

19. The method of claim 18, wherein the wafer-level process includes a rapid thermal anneal (RTA) process.

20. The method of claim 18, wherein the wafer-level process includes a furnace anneal process.

21. The method of claim 18, wherein the wafer-level process includes heating the semiconductor wafer to a temperature of 950° C. or higher.

22. The method of claim 18, wherein the wafer-level process includes heating the semiconductor wafer to a temperature of about 1000° C. for about 15 s.

* * * * *